(12) United States Patent
Klennert

(10) Patent No.: US 11,367,996 B2
(45) Date of Patent: Jun. 21, 2022

(54) CONTROL SYSTEM FOR REGULATING TEMPERATURE FOR LASER DIODES

(71) Applicant: The Boeing Company, Chicago, IL (US)

(72) Inventor: Wade L Klennert, Albuquerque, NM (US)

(73) Assignee: The Boeing Company, Chicago, IL (US)

( * ) Notice: Subject to any disclaimer, the term of this patent is extended or adjusted under 35 U.S.C. 154(b) by 208 days.

(21) Appl. No.: 16/898,547

(22) Filed: Jun. 11, 2020

(65) Prior Publication Data

US 2021/0391686 A1 Dec. 16, 2021

(51) Int. Cl.
*H01S 5/024* (2006.01)
*H01S 5/068* (2006.01)
*H01S 5/06* (2006.01)

(52) U.S. Cl.
CPC ........ *H01S 5/02453* (2013.01); *H01S 5/0612* (2013.01); *H01S 5/06804* (2013.01); *H01S 5/02469* (2013.01)

(58) Field of Classification Search
CPC .................................................... H01S 5/0612
USPC ........................................................... 372/34
See application file for complete search history.

(56) References Cited

U.S. PATENT DOCUMENTS

| 2009/0323742 | A1* | 12/2009 | Kumano | H04N 9/3161 |
|---|---|---|---|---|
| | | | | 372/34 |
| 2011/0225983 | A1* | 9/2011 | Kojima | H01L 23/38 |
| | | | | 62/3.7 |
| 2016/0141825 | A1* | 5/2016 | Klennert | H01S 5/02469 |
| | | | | 372/34 |

\* cited by examiner

*Primary Examiner* — Tuan N Nguyen
(74) *Attorney, Agent, or Firm* — Vivacqua Crane, PLLC

(57) ABSTRACT

A control system includes one or more laser diodes generating a spectral output at a specific center wavelength when the one or more laser diodes are at a target temperature range, one or more oscillating heat pipes, one or more sensors configured to monitor a current temperature of the one or more laser diodes, and a heater configured to generate heat. The one or more laser diodes are thermally coupled to the one or more oscillating heat pipes. The control system also includes one or more processors in electronic communication with the one or more laser diodes and the heater and a memory coupled to the one or more processors. The memory stores data into one or more databases and program code that, when executed by the one or more processors, causes the control system to instruct the heater to generate heat for pre-heating the one or more laser diodes to the target temperature range.

20 Claims, 4 Drawing Sheets

CONTROL SYSTEM FOR REGULATING TEMPERATURE FOR LASER DIODES

INTRODUCTION

The present disclosure relates to a control system for one or more laser diodes. More particularly, the present disclosure is directed towards a control system for regulating temperature for laser diodes.

BACKGROUND

Laser diodes are semiconductor devices that produce coherent light. Laser diodes may also be referred to as injection diodes or, alternatively, diode lasers. Laser diodes may be used in a variety of applications such as, but not limited to, fiber optic communications, barcode readers, laser pointers, disk reading and recording, laser printing, and directional lighting sources.

Laser diodes convert electrical energy into light at an efficiency ranging from about ten to about fifty percent, while the rest of the electrical energy is converted into heat. The center wavelength of a laser diode is directly proportional to its operating temperature. Specifically, for example, a change of about three degree Celsius in the operating temperature typically results in the center wavelength of the laser diode shifting by about one nanometer. Most low-power lasers may only require passive cooling via a heat sink or natural airflow, however, most high-power laser diode require active cooling. A high-power laser diode is typically capable of producing at least one hundred Watts of emitted light, although the amount of light may be more depending upon the application. Inadequate laser diode cooling may result in issues such as, for example, degradation in beam quality or an excessive shift in center wavelength.

One approach to regulate the operating temperature of a laser diode involves a refrigerant or other cooling medium that undergoes phase transitions. Specifically, two-phase cooling or refrigeration cycles maintain the operating temperature in a laser diode by providing a constant fluid temperature to a base of a laser diode module. However, this may substantially increase the size and weight of the laser diode, the amount of power required to operate the laser diode, and in some instances may limit the duty cycle of the laser diode. In another approach, the laser diodes are soldered to copper heat spreaders. A copper heat spreader may provide sufficient cooling for a lower-power laser diode but is usually unable to sufficiently cool a higher powered laser diode.

SUMMARY

According to several aspects, a control system is disclosed, and comprises one or more laser diodes, one of more heat oscillating pipes, one or more sensors, and a heater. The one or more laser diodes are configured to generate a spectral output at a specific center wavelength when the one or more laser diodes are at a target temperature range. The one or more laser diodes are thermally coupled to the one or more oscillating heat pipes. The one or more sensors are configured to monitor a current temperature of the one or more laser diodes. The heater is configured to generate heat, where the heater is in thermal communication with the one or more laser diodes. The control system also includes one or more processors in electronic communication with the one or more laser diodes and the heater and a memory coupled to the one or more processors, the memory storing data into one or more databases and program code that, when executed by the one or more processors, causes the control system to monitor the one or more sensors for an output indicative of the current temperature of the one or more laser diodes. The control system compares the current temperature with the target temperature range of the one or more laser diodes. In response to determining the current temperature is less than the target temperature range of the one or more laser diodes, the system instructs the heater to generate heat for pre-heating the one or more laser diodes to the target temperature range.

In another aspect, a control system for regulating temperature is disclosed, and comprises one or more laser diodes configured to generate a spectral output at a specific center wavelength when the one or more laser diodes are at a target temperature range. The one or more laser diodes include a diode threshold current and a lasing threshold current. The control system also includes one or more oscillating heat pipes, where the one or more laser diodes are thermally coupled to the one or more oscillating heat pipes. The control system further includes one or more sensors configured to monitor a current temperature of the one or more laser diodes and one or more processors in electronic communication with the one or more laser diodes. The one or more processors are configured to provide a drive current to the one or more laser diodes. The control system also includes a memory coupled to the one or more processors, the memory storing data into one or more databases and program code that, when executed by the one or more processors, causes the control system to monitor the one or more sensors for an output indicative of the current temperature of the one or more laser diodes. The control system is also caused to compare the current temperature with the target temperature range of the one or more laser diodes. In response to determining the current temperature is less than the target temperature range of the one or more laser diodes, the control system provides the drive current to the one or more laser diodes. The drive current is less than the diode threshold current and the lasing threshold current of the one or more laser diodes. The control system continues to monitor the one or more sensors until the current temperature is at least equal to the target temperature range. Finally, in response to determining the current temperature is at least equal to the target temperature range, activate the one or more laser diodes.

In still another aspect, method for maintaining temperature for one or more laser diodes is disclosed. The method includes monitoring, by a computer, one or more sensors for an output indicative of a current temperature of the one or more laser diodes that are part of a control system. The method also includes comparing, by the computer, the current temperature with a target temperature range of the one or more laser diodes, where the one or more laser diodes are configured to generate a spectral output at a specific center wavelength when the one or more laser diodes are at the target temperature range. In response to determining the current temperature is less than the target temperature range of the one or more laser diodes, the method includes instructing a heater to generate heat for pre-heating the one or more laser diodes to the target temperature range.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

The present disclosure is directed towards a control system for managing the temperature of one or more laser diodes. The laser diodes are configured to generate a spectral output at a specific center wavelength when operating at a target temperature range. In an embodiment, a heater is provided to pre-heat the laser diodes to their respective target temperature range prior to the laser diodes being activated to generate light. If the one or more laser diodes are heated to a temperature that is greater than the target temperature range, then one or more blowers generate airflow to cool the laser diodes. In one embodiment, a drive current is applied to the laser diodes to pre-heat to laser diodes to the respective target temperature range. In one approach, the laser diodes are heated to their respective target temperature range using only drive current, however, in another embodiment, the laser diodes are heated to the target temperature range using a combination of the heater and the drive current.

The following description is merely exemplary in nature and is not intended to limit the present disclosure, application, or uses.

Figure 1:
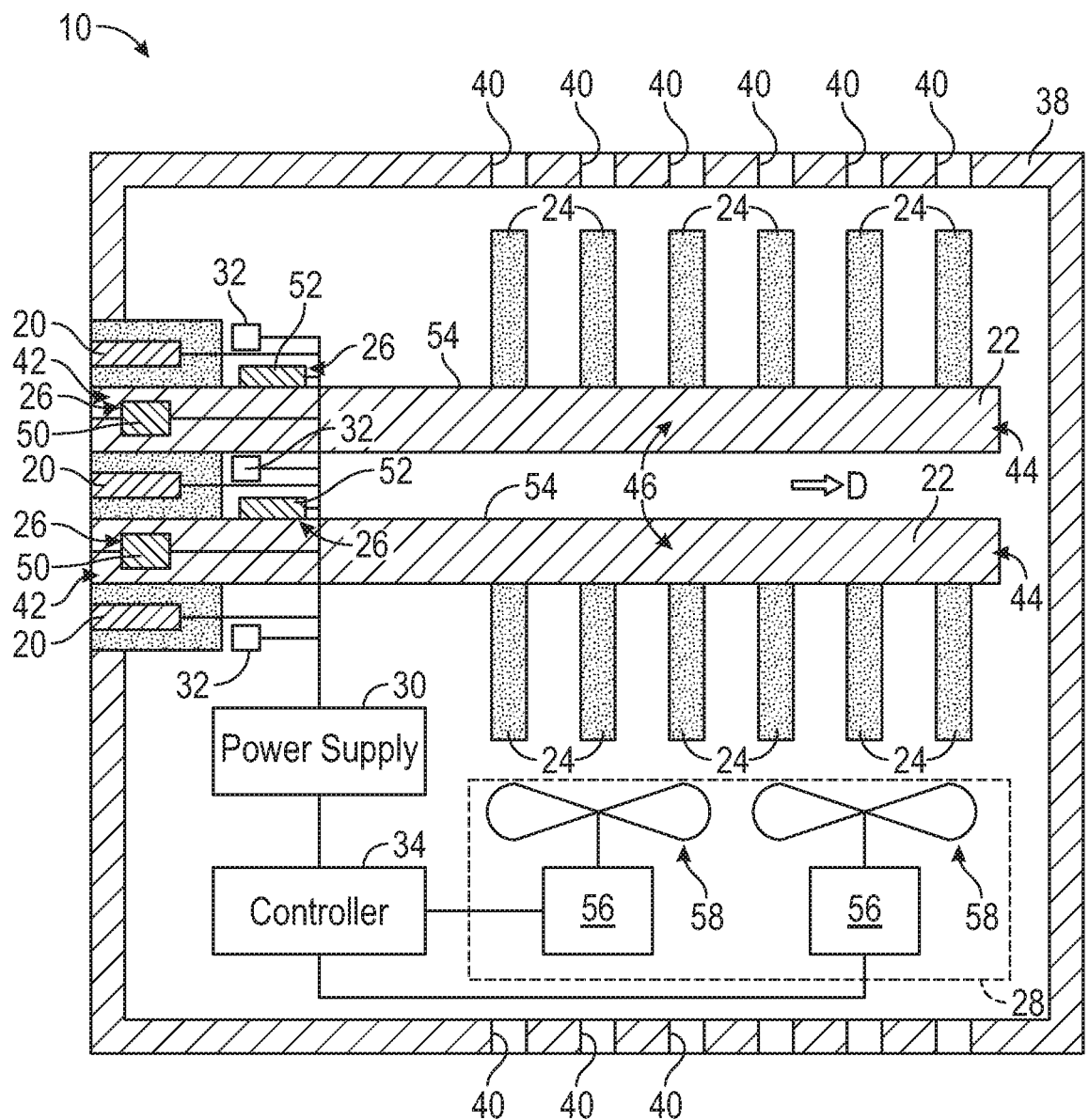
FIG. 1 is a schematic diagram of a control system for managing the temperature of one or more laser diodes, according to an exemplary embodiment.

Referring to FIG. 1, a schematic diagram of a control system 10 for regulating the temperature of one or more laser diodes 20 is illustrated. The control system 10 includes the laser diodes 20, one or more oscillating heat pipes 22, one or more heat dissipating fins 24, a heater 26, one or more airflow sources 28, a power supply 30, one or more sensors 32, and one or more controllers 34. The controllers 34 are in electronic communication with the laser diodes 20, the heater 26, the airflow source 28, and the sensors 32. The laser diodes 20 are configured to generate a spectral output at a specific center wavelength when the one or more laser diodes 20 operate at a target temperature range. The spectral output describes an intensity of light generated by the laser diodes 20 over a range of wavelengths in the electromagnetic spectrum. The one or more laser diodes 20 are thermally coupled to and are disposed on the one or more oscillating heat pipes 22. Accordingly, heat generated by the laser diodes 20 are dissipated into ambient air by the one or more oscillating heat pipes 22. As explained below, the control system 10 regulates the operating temperature of the one or more laser diodes 20.

The power supply 30 is configured to provide electrical power to the one or more laser diodes 20, the heater 26, the airflow source 28, and the controller 34. The power supply 30 may be any type of source of electrical power such as, for example, one or more batteries. The laser diodes 20 are configured to convert the electrical power into light, where the light may be part of the visible, infrared, or ultraviolet spectrum. In one embodiment, a laser gain device is also provided in combination with the laser diodes 20. The laser gain devices are not pumped. Instead, the laser diode 20 is configured to optically pump the laser gain material.

The specific center wavelength of the spectral output of the one or more laser diodes 20 is based on the current temperature of the laser diodes 20. Specifically, changes in the operating temperature of the laser diodes 20 affect a bandgap of a p-n junction of the laser diodes 20, which in turn affects the center wavelength of the spectral output generated by the laser diodes 20. Furthermore, a drive current supplied to the one or more laser diodes 20 also affects the center wavelength of the spectral output generated by the laser diodes 20. Accordingly, as explained below, the disclosed control system 10 maintains the operating temperature of the laser diodes 20 at their respective target temperature range, thereby maintaining the spectral output of the laser diodes 20 at the specific center wavelength.

In the non-limiting embodiment as shown in FIG. 1, the control system 10 includes two oscillating heat pipes 22, however, it is to be appreciated that any number of oscillating heat pipes 22 may be used and FIG. 1 is merely exemplary in nature. Each oscillating heat pipe 22 includes a first end 42, a second end 44, and a central portion 46 located between the first end 42 and the second end 44 of the one or more oscillating heat pipes 22. In the non-limiting embodiment as shown in FIG. 1, the laser diodes 20 are thermally coupled to and disposed on the first end 42 of a respective oscillating heat pipe 22, however, in another embodiment the laser diodes 20 are placed on the central portion 46 of the respective oscillating heat pipe 22 instead. The one or more oscillating heat pipes 22 are any component having serpentine capillaries (not shown) such as, but not limited to, a meandering tube flat sheet. The capillaries are partially filled with a working fluid, where a boiling point of the working fluid is comparable to or less than the operating temperature of the one or more laser diodes 20. The working fluid flows in a heat transfer direction D that extends from the first end 42 to the second end 44 of the one or more oscillating heat pipes 22. Accordingly, a heat transfer coefficient of the one or more oscillating heat pipes 22 is at a maximum value in the heat transfer direction D between the first end 42 and the second end 44. Furthermore, it is to be appreciated that the heat generated by laser diodes 20 is transferred to the second end 44 of the one or more oscillating heat pipes 22.

The control system 10 also includes an enclosure 38 that contains the laser diodes 20, the oscillating heat pipes 22, the heat dissipating fins 24, the heater 26, the airflow sources 28, the power supplies 30, the sensors 32, and the controller 34. In the non-limiting embodiment as shown in FIG. 1, the power supply 30 and the controller 34 are shown within the enclosure 38, however, in another embodiment the power supply 30 and the controller 34 are in their own enclosure and electrically connected to one another. The enclosure 38 may include one or more openings 40 for allowing air to circulate between an outside environment 48 and air located within the enclosure 38. One or more heat dissipating fins 24 are disposed upon and thermally coupled to the oscillating heat pipes 22. In one embodiment, the heat dissipating fins 24 and the oscillating heat pipes 22 form a monolithic structure. That is, the heat dissipating fins 24 and the oscillating heat pipes 22 are constructed from the same block of material. Alternatively, in another embodiment, the heat dissipating fins 24 are removably attached to a corresponding oscillating heat pipe 22.

In the non-limiting embodiment as shown, the heat dissipating fins 24 are disposed along the central portion 46 and the second end 44 of the one or more oscillating heat pipes 22. The heat dissipating fins 24 are exposed to and cooled by air from the outside environment 48 that travels into the enclosure 38 through the openings 40. However, in some embodiments, the heat dissipating fins 24 are omitted. Instead, the heat generated by the laser diodes 20 is dissipated directly from the oscillating heat pipes 22.

The sensors 32 are configured to monitor a current temperature of the one or more laser diodes 20. In one embodiment, the sensors 32 are wavelength sensors that generate an output that indicates a wavelength of the light generated by the one or more laser diodes 20, where the current temperature of the one or more laser diodes 20 is determined based on the wavelength of the light generated by the one or more laser diodes 20. Alternatively, in another embodiment, the sensors 32 are temperature sensors that generate an output that indicates the temperature of the one or more laser diodes 20.

The heater 26 is in thermal communication with the one or more laser diodes 20, where heat generated by the heater 26 is transferred to the one or more laser diodes 20. In one embodiment, the heater 26 includes one or more internal heating elements 50 disposed within the oscillating heat pipes 22. In another embodiment the heater 26 includes one or more external heating elements 52 disposed along an outer surface 54 of the oscillating heat pipes 22. For example, the internal heating elements 50 include one or more internal cartridge type heaters, and the external heating elements 52 include one or more surface-mounted strip heaters. It is to be appreciated that FIG. 1 is merely exemplary in nature, and the heater 26 may be placed in any location where there is a heat conducting path to the one or more laser diodes 20.

The heater 26 is in electronic communication with the controller 34. As explained below, the heater 26 is controlled based on the output of the sensors 32. The heater 26 may be controlled using a variety of approaches such as, for example, pulse width modulation (PWM) or variable voltage control. The controller 34 instructs the heater 26 to generate heat, and the heater 26 pre-heats the laser diodes 20 to their respective target temperature range. Thus, the heater 26 is configured to provide the heat that elevates the temperature of the laser diodes 20 to their target temperature range prior to the laser diodes 20 being activated to generate light.

In the exemplary embodiment as shown, the airflow source 28 includes one or more blowers 56 configured to generate airflow when turned on, where the airflow generated by the blowers 56 is directed over the one or more laser diodes 20. The controller 34 is in electronic communication with the blowers 56 and instruct the blowers 56 to generate airflow based on the output of the sensors 32. The blowers 56 may be controlled using a variety of approaches such as, for example, PWM or variable voltage control. As explained below, in response to the controller 34 determining the current temperature of the one or more laser diodes 20 is greater than the target temperature range, the controller 34 instructs the blowers 56 to generate airflow. The airflow may be generated by either activating the blower 56 or by increasing a speed of the blower 56.

In the non-limiting embodiment as shown in FIG. 1, the blowers 56 include one or more fans 58, however, it is to be appreciated that the airflow source 28 is not limited to a fan and other types of devices for providing airflow may be used as well. Some examples of alternative airflow sources 28 include, but are not limited to, a source of compressed air that is released by a valve in electrical communication with the controller 34. In another embodiment, the airflow source 28 is ram air, where the controller 34 is in electronic communication with a butterfly valve or similar device for controlling the amount of airflow. In still another embodiment, the airflow source 28 is an air charge machine that includes a powered fan that pulls in outside air into the enclosure 38. It is to be appreciated that in same embodiments the airflow source 28 includes more than one device. Accordingly, the airflow source 28 comprises of one or more of the following: the blower 56, a source of compressed air, ram air, and an air charge machine.

In still another embodiment, the airflow source 28 may not provide adequate cooling. Accordingly, in one embodiment the control system 10 includes a source of air and water, where air and water are sprayed over the fins 24 in addition to air cooling. In yet another embodiment, if the enclosure 38 is part of a structure where it is not possible to receive airflow, an intermediate water cooling loop that is cooled by a radiator located in an external environment may be provided instead.

In one embodiment the controller 34 applies the drive current to heat the laser diodes 20. The drive current is less than a diode threshold current and a lasing threshold current of the one or more laser diodes 20. When the laser diodes 20 are at the diode threshold current, they behave similar to a light-emitting diode and spontaneously emit light having a wide spectrum of wavelengths. By contrast, the lasing threshold current represents the lowest excitation level at which an output of the laser diodes 20 is dominated by stimulated emission rather than by spontaneous emission. In one embodiment, the laser diodes 20 are maintained at the target temperature range using a combination of heat generated by the heater 26, by applying the drive current to the one or more laser diodes 20, and by the airflow generated by the airflow source 28.

In an alternative embodiment, the laser diodes 20 are heated to the target temperature range by only applying the drive current to the one or more laser diodes 20. Specifically, in response to determining the current temperature is less than the target temperature range of the one or more laser diodes 20, the controller 34 is configured to provide the drive current to the one or more laser diodes 20. The controller 34 continues to monitor the one or more sensors 32 until the current temperature is at least equal to the target temperature range. In response to determining the current temperature is at least equal to the target temperature range, in one embodiment the controller 34 then activates the one or more laser diodes 20. Alternatively, in another embodiment, the controller 34 maintains the current temperature of the laser diodes 20 until the laser diodes 20 are activated.

Figure 2A:
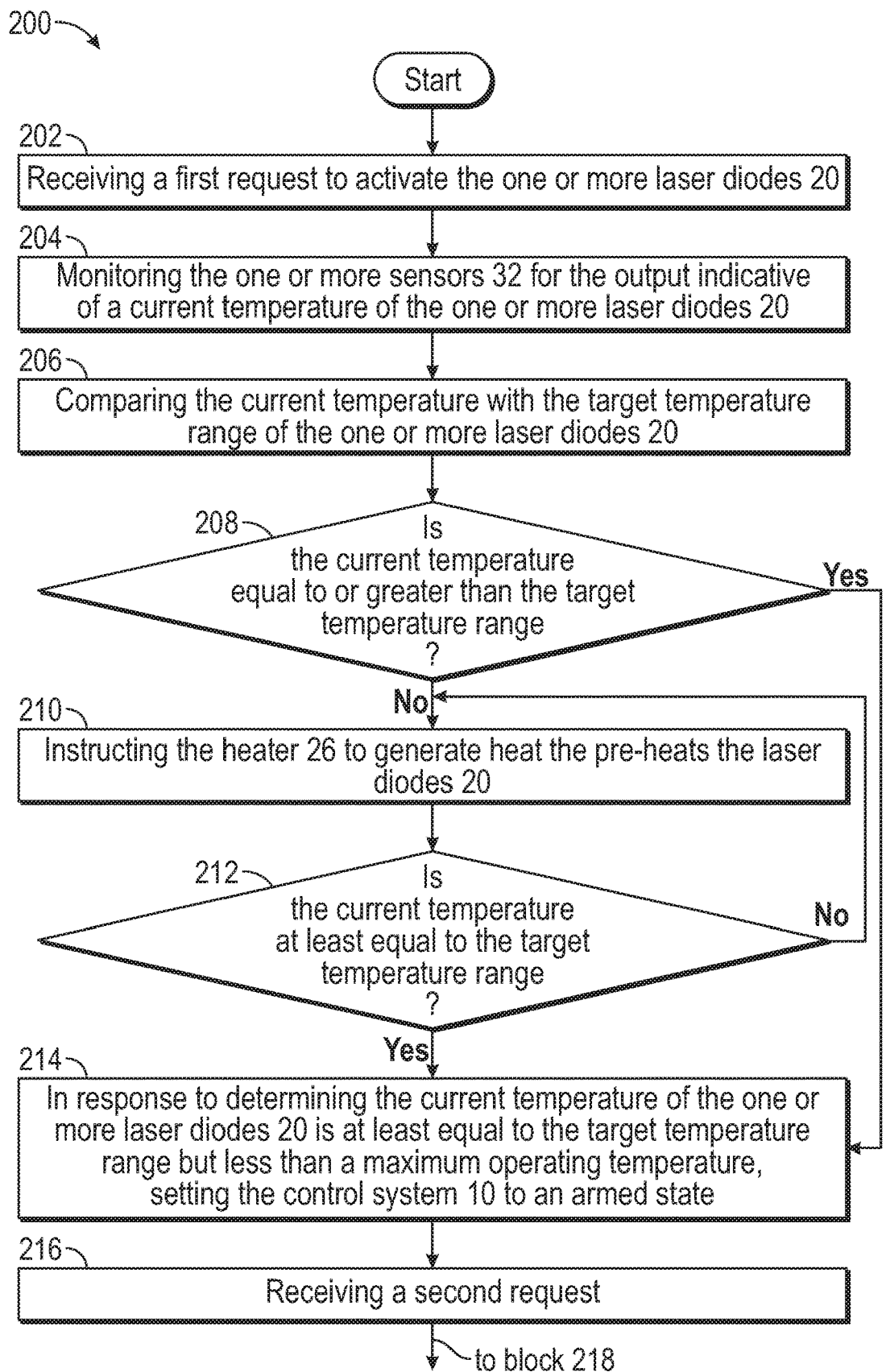
FIGS. 2A-2B illustrate a process flow diagram illustrating a method for maintaining the temperature of the one or more laser diodes, according to an exemplary embodiment.
Figure 2B:
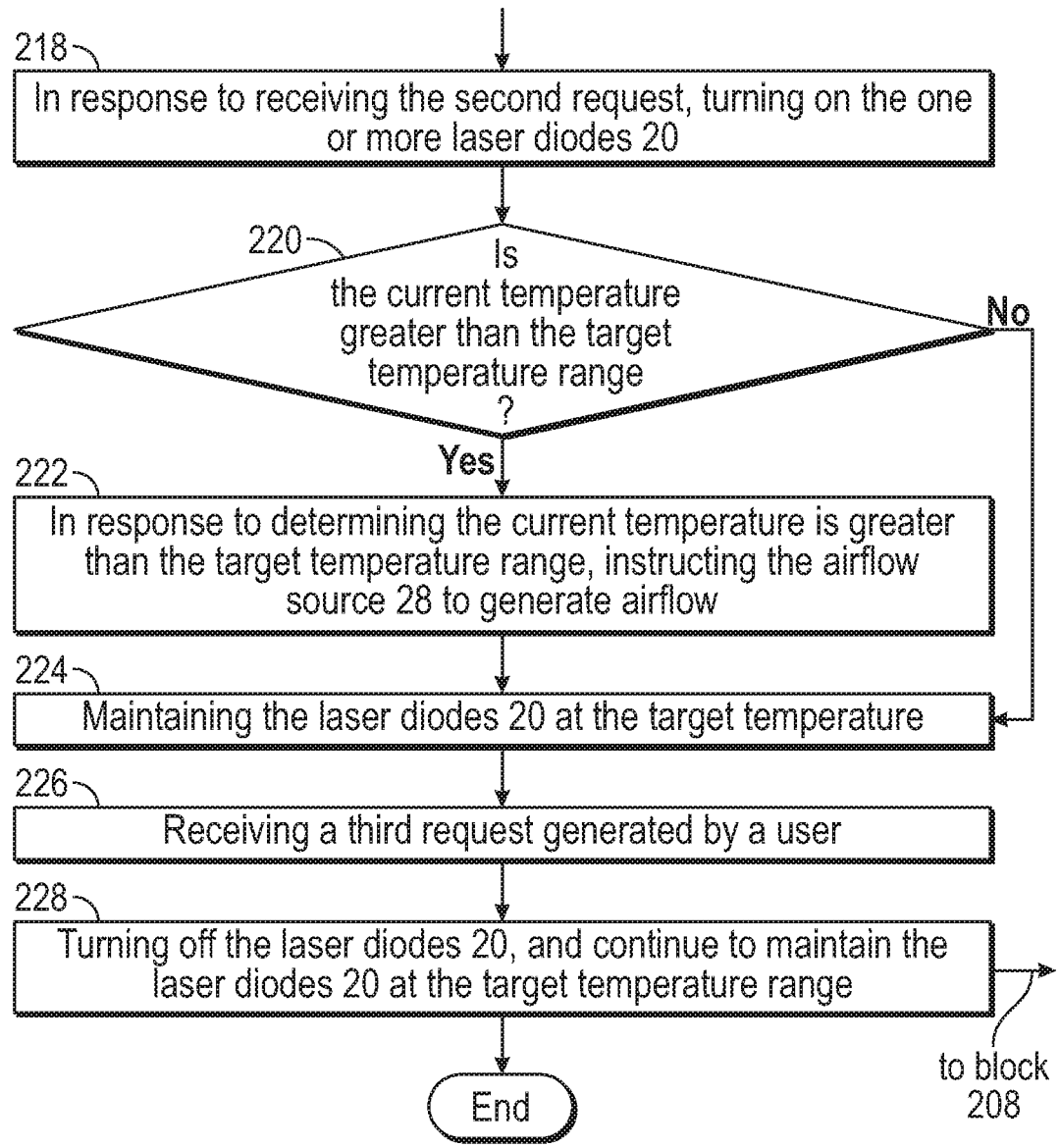

FIGS. 2A-2B illustrate a process flow diagram illustrating a method 200 for maintaining the temperature of the one or more laser diodes 20, where the heater 26 pre-heats the laser diodes 20 to their respective target temperature ranges. The method also includes air cooling the laser diodes 20 when the laser diodes 20 exceed the target temperature range by the airflow source 28. In other words, the airflow source 28 may be used to air cool the laser diodes 20 in the event they are excessively pre-heated.

Referring to FIGS. 1 and 2A, the method 200 begins at block 202. In block 202, the controller 34 receives a first request to activate the one or more laser diodes 20. The first request activates the control system 10. Specifically, in one embodiment, the first request turns the control system 10 on, however, the control system 10 is in an unarmed state. When in the unarmed state, one or more processors 1032 (FIG. 3) that are part of the controller 34 monitor the control system 10 for health and status. However, when the control system 10 is in the unarmed state, the controller 34 is prevented from conveying electrical power to the one or more laser diodes 20. For example, in one embodiment, a mechanical disconnect such as a relay ensures electrical power may not reach the laser diodes 20 when the control system 10 is in the unarmed state. The method 200 may then proceed to block 204.

In block 204, in response to receiving the first request, the controller 34 monitors the one or more sensors 32 for the output indicative of the current temperature of the one or more laser diodes 20. As mentioned above, in one embodiment the sensors 32 are wavelength sensors and the output indicates the wavelength of the light generated by the laser diodes 20. Alternatively, in another embodiment, the one or more sensors 32 are temperature sensors. The method 200 may then proceed to block 206.

In block 206, the controller 34 compares the current temperature with the target temperature range of the one or more laser diodes 20. The method 200 may then proceed to decision block 208.

In decision block 208, if the current temperature is equal to greater than the target temperature range of the one or more laser diodes 20, then the method 200 may proceed to block 214. However, in response to determining the current temperature of the laser diodes 20 are less than the target temperature range, the method 200 proceed to block 210. In block 210, the controller 34 instructs the heater 26 to generate heat for pre-heating the laser diodes 20 to the target temperature range. The method 200 may then proceed to block 212.

In block 212, the controller 34 continues to monitor the one or more sensors 32 until the current temperature is at least equal to the target temperature range of the laser diodes 20. The method 200 may then proceed to block 214.

In block 214, in response to determining the current temperature of the one or more laser diodes 20 is at least equal to the target temperature range but less than a maximum operating temperature, the control system 10 is switched from the unarmed state to an armed state. When the control system 10 is in the armed state, the controller 34 is allowed to convey electrical power to the one or more laser diodes 20. As mentioned above, the controller 34 is unable to convey electrical power to the one or more laser diodes 20 in the unarmed state. It is to be appreciated that the message instructing the control system 10 to switch from the unarmed state to the armed state is generated externally by another controller or, alternatively, by an operator.

In another embodiment, in response to determining the current temperature of the one or more laser diodes 20 is at least equal to the target temperature range, a health and status message that informs the controller 34 the laser diodes 20 are ready for arming is generated, and the control system 10 is switched to the armed state in block 216. The method 200 may then proceed to block 216.

In block 216, the controller 34 receives a second request. The second request is generated by a user and instructs the laser diodes 20 to turn on. Referring now to FIGS. 1 and 2B, in block 218, in response to receiving the second request, the controller 34 turns on the one or more laser diodes 20. The method 200 may then proceed to decision block 220.

In decision block 220, the controller 34 determines if the current temperature of the one or more laser diodes 20 is greater than the target temperature range of the one or more laser diodes 20. If the current temperature is less than or equal to the target temperature range, then the method 200 may proceed to block 224. However, sometimes the heater 26 may pre-heat the laser diodes 20 excessively, and the controller determines the current temperature of the one or more laser diodes 20 is greater than the target temperature range. The method 200 may then proceed to block 222.

In block 222, in response to determining the current temperature is greater than the target temperature range, the controller 34 instructs the airflow source 28 to generate airflow. The airflow air cools the one or more laser diodes 20 to the target temperature range. The method 200 may then proceed to block 224.

In block 224, the laser diodes 20 are maintained at the target temperature range by modulating the electrical power supplied to the heater 26, the airflow source 28 (if applicable), and in one embodiment, by providing the drive current. Specifically, in one embodiment, the controller 34 provides the drive current to the one or more laser diodes 20. The method 200 may then proceed to block 226.

In block 226, the controller 34 receives a third request generated by a user. The third request instructs the controller 34 to turn the laser diodes 20 off. The method 200 may then proceed to block 228.

In block 228, the controller 34 turns off the one or more laser diodes 20. However, it is to be appreciated that the control system 10 may continue to maintain the laser diodes 20 at the target temperature range in the event a user generates another request to activate the laser diodes 20 again. Accordingly, the method 200 may then return to block 208 or, alternatively, the control system 10 is powered down and the method 200 terminates.

Referring generally to the figures, the disclosed control system provides various technical effects and benefits. Specifically, the disclosed control system pre-heats the laser diodes, which in turn allows for the laser diodes to operate at their appropriate target temperature ranges, which in turn allows for the laser diodes to generate the correct wavelength when activated. The disclosed control system also allows heat generated by the laser diodes to be rejected directly into the air. Furthermore, the disclosed control system maintains the temperature of the laser diodes without substantially increasing the size or weight of the laser diode, or the amount of power required to operate the laser diode. In contrast, conventional cooling systems for laser diodes may include two-phase cooling or refrigeration cycles for maintaining the operating temperature in a laser diode, which in turn introduces significant size and weight while also increasing the power requirements of the system.

Figure 3:
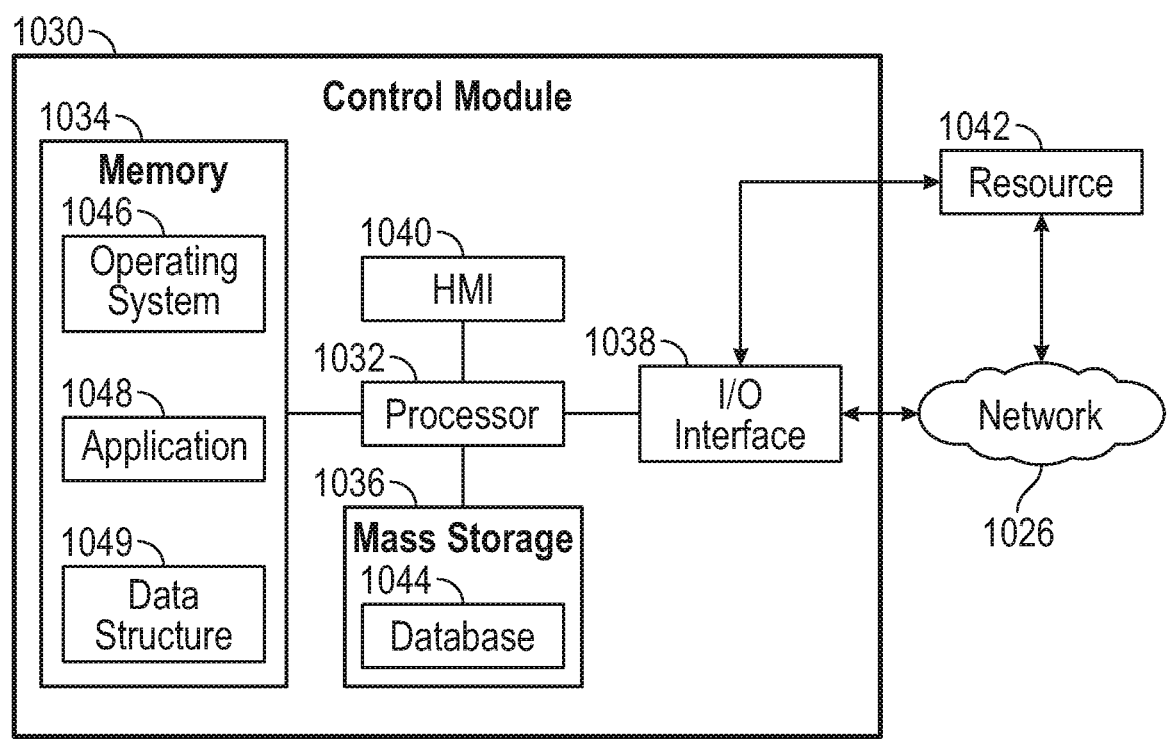
FIG. 3 is the computing system for the disclosed control system shown in FIG. 1, according to an exemplary embodiment.

Referring to FIG. 3, the controller 34 is implemented on one or more computer devices or systems, such as exemplary computer system 1030. The computer system 1030 includes a processor 1032, a memory 1034, a mass storage memory device 1036, an input/output (I/O) interface 1038, and a Human Machine Interface (HMI) 1040. The computer system 1030 is operatively coupled to one or more external resources 1042 via the network 1026 or I/O interface 1038. External resources may include, but are not limited to, servers, databases, mass storage devices, peripheral devices, cloud-based network services, or any other suitable computer resource that may be used by the computer system 1030.

The processor 1032 includes one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 1034. Memory 1034 includes a single memory device or a plurality of memory devices including, but not limited to, read-only memory (ROM), random access memory (RAM), volatile memory, non-volatile memory, static random-access memory (SRAM), dynamic random-access memory (DRAM), flash memory, cache memory, or any other device capable of storing information. The mass storage memory device 1036 includes data storage devices such as a hard drive, optical drive, tape drive, volatile or non-volatile solid-state device, or any other device capable of storing information.

The processor 1032 operates under the control of an operating system 1046 that resides in memory 1034. The operating system 1046 manages computer resources so that computer program code embodied as one or more computer software applications, such as an application 1048 residing in memory 1034, may have instructions executed by the processor 1032. In an alternative example, the processor 1032 may execute the application 1048 directly, in which case the operating system 1046 may be omitted. One or more data structures 1049 also reside in memory 1034, and may be used by the processor 1032, operating system 1046, or application 1048 to store or manipulate data.

The I/O interface 1038 provides a machine interface that operatively couples the processor 1032 to other devices and systems, such as the network 1026 or external resource 1042. The application 1048 thereby works cooperatively with the network 1026 or external resource 1042 by communicating via the I/O interface 1038 to provide the various features, functions, applications, processes, or modules comprising examples of the disclosure. The application 1048 also includes program code that is executed by one or more external resources 1042, or otherwise rely on functions or signals provided by other system or network components external to the computer system 1030. Indeed, given the nearly endless hardware and software configurations possible, persons having ordinary skill in the art will understand that examples of the disclosure may include applications that are located externally to the computer system 1030, distributed among multiple computers or other external resources 1042, or provided by computing resources (hardware and software) that are provided as a service over the network 1026, such as a cloud computing service.

The HMI 1040 is operatively coupled to the processor 1032 of computer system 1030 in a known manner to allow a user to interact directly with the computer system 1030. The HMI 1040 may include video or alphanumeric displays, a touch screen, a speaker, and any other suitable audio and visual indicators capable of providing data to the user. The HMI 1040 also includes input devices and controls such as an alphanumeric keyboard, a pointing device, keypads, pushbuttons, control knobs, microphones, etc., capable of accepting commands or input from the user and transmitting the entered input to the processor 1032.

A database 1044 may reside on the mass storage memory device 1036 and may be used to collect and organize data used by the various systems and modules described herein. The database 1044 may include data and supporting data structures that store and organize the data. In particular, the database 1044 may be arranged with any database organization or structure including, but not limited to, a relational database, a hierarchical database, a network database, or combinations thereof. A database management system in the form of a computer software application executing as instructions on the processor 1032 may be used to access the information or data stored in records of the database 1044 in response to a query, where a query may be dynamically determined and executed by the operating system 1046, other applications 1048, or one or more modules.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A control system, comprising:
one or more laser diodes configured to generate a spectral output at a specific center wavelength when the one or more laser diodes are at a target temperature range;
one or more oscillating heat pipes, wherein the one or more laser diodes are thermally coupled to the one or more oscillating heat pipes;
one or more sensors configured to monitor a current temperature of the one or more laser diodes;
a heater configured to generate heat, wherein the heater is in thermal communication with the one or more laser diodes;
one or more processors in electronic communication with the one or more laser diodes and the heater; and
a memory coupled to the one or more processors, the memory storing data into one or more databases and program code that, when executed by the one or more processors, causes the control system to:
monitor the one or more sensors for an output indicative of the current temperature of the one or more laser diodes;
compare the current temperature with the target temperature range of the one or more laser diodes; and
in response to determining the current temperature is less than the target temperature range of the one or more laser diodes, instructing the heater to generate heat for pre-heating the one or more laser diodes to the target temperature range.

2. The control system of claim 1, wherein the one or more processors execute instructions to:
receive a first request to activate the one or more laser diodes; and
in response to receiving the first request, monitor the one or more sensors for the current temperature of the one or more laser diodes.

3. The control system of claim 2, wherein the one or more processors execute instructions to:
in response to determining the current temperature of the one or more laser diodes is at least equal to the target temperature range, switch the control system from an unarmed state to an armed state.

4. The control system of claim 3, wherein the one or more processors are prevented from conveying electrical power to the one or more laser diodes in the unarmed state, and wherein the one or more processors are allowed to convey electrical power to the one or more laser diodes in the armed state.

5. The control system of claim 1, wherein the one or more sensors are wavelength sensors and the output indicates a wavelength of light generated by the one or more laser diodes.

6. The control system of claim 1, wherein the one or more sensors are temperature sensors and the output indicates a temperature of the one or more laser diodes.

7. The control system of claim 1, further comprising:
an airflow source configured to generate airflow directed over the one or more laser diodes, and wherein the one or more processors are in electronic communication with the airflow source.

8. The control system of claim 7, wherein the one or more processors execute instructions to:
determine the current temperature is greater than the target temperature range of the one or more laser diodes; and
in response to determining the current temperature is greater than the target temperature range of the one or more laser diodes, instruct the airflow source to generate airflow.

9. The control system of claim 7, wherein the one or more processors execute instructions to:
maintain the one or more laser diodes at the target temperature range by modulating electrical power supplied to the heater and the airflow source and by providing a drive current to the one or more laser diodes.

10. The control system of claim 7, wherein the airflow source comprises of one or more of the following: a blower, a source of compressed air, ram air, and an air charge machine.

11. The control system of claim 1, wherein the specific center wavelength of the spectral output of the one or more laser diodes is based on the current temperature of the one or more laser diodes and a drive current supplied to the one or more laser diodes, and the drive current is less than a diode threshold current and a lasing threshold current of the one or more laser diodes.

12. The control system of claim 1, wherein the heat generated by the heater pre-heats the one or more laser diodes prior to the one or more laser diodes being activated.

13. The control system of claim 1, wherein the one or more oscillating heat pipes include a first end, a second end, and a central portion located between the first end and the second end of the one or more oscillating heat pipes.

14. The control system of claim 13, wherein the one or more laser diodes are thermally coupled to either the central portion or the first end of the one or more oscillating heat pipes.

15. The control system of claim 1, further comprising one or more heat dissipating fins that are thermally coupled to the one or more oscillating heat pipes.

16. A control system for regulating temperature, comprising:
one or more laser diodes configured to generate a spectral output at a specific center wavelength when the one or more laser diodes are at a target temperature range, wherein the one or more laser diodes include a diode threshold current and a lasing threshold current;
one or more oscillating heat pipes, wherein the one or more laser diodes are thermally coupled to the one or more oscillating heat pipes;
one or more sensors configured to monitor a current temperature of the one or more laser diodes;
one or more processors in electronic communication with the one or more laser diodes, wherein the one or more processors are configured to provide a drive current to the one or more laser diodes; and
a memory coupled to the one or more processors, the memory storing data into one or more databases and program code that, when executed by the one or more processors, causes the control system to:
monitor the one or more sensors for an output indicative of the current temperature of the one or more laser diodes;
compare the current temperature with the target temperature range of the one or more laser diodes;
in response to determining the current temperature is less than the target temperature range of the one or more laser diodes, provide the drive current to the one or more laser diodes, wherein the drive current is less than the diode threshold current and the lasing threshold current of the one or more laser diodes;
continue to monitor the one or more sensors until the current temperature is at least equal to the target temperature range; and
in response to determining the current temperature is at least equal to the target temperature range, activate the one or more laser diodes.

17. A method for maintaining temperature for one or more laser diodes, the method comprising:
monitoring, by a computer, one or more sensors for an output indicative of a current temperature of the one or more laser diodes that are part of a control system;
comparing, by the computer, the current temperature with a target temperature range of the one or more laser diodes, wherein the one or more laser diodes are configured to generate a spectral output at a specific center wavelength when the one or more laser diodes are at the target temperature range; and
in response to determining the current temperature is less than the target temperature range of the one or more laser diodes, instructing a heater to generate heat for pre-heating the one or more laser diodes to the target temperature range.

18. The method of claim 17, further comprising:
in response to determining the current temperature of the one or more laser diodes is at least equal to the target temperature range, switching the control system from an unarmed state to an armed state.

19. The method of claim 17, further comprising:
determining the current temperature is greater than the target temperature range of the one or more laser diodes; and
in response to determining the current temperature is greater than the target temperature range of the one or more laser diodes, instructing an airflow source to generate airflow.

20. The method of claim 19, further comprising:
maintaining the one or more laser diodes at the target temperature range by modulating electrical power supplied to the heater and the airflow source and by providing a drive current to the one or more laser diodes.

* * * * *